United States Patent
Minowa

(10) Patent No.: US 7,224,084 B2
(45) Date of Patent: May 29, 2007

(54) INTERFACE CIRCUIT

(75) Inventor: Manabu Minowa, Kanagawa (JP)

(73) Assignee: Oki Electric Industry Co., Ltd., Tokyo (JP)

( * ) Notice: Subject to any disclaimer, the term of this patent is extended or adjusted under 35 U.S.C. 154(b) by 425 days.

(21) Appl. No.: 10/720,387

(22) Filed: Nov. 25, 2003

(65) Prior Publication Data

US 2004/0108885 A1    Jun. 10, 2004

(30) Foreign Application Priority Data

Dec. 10, 2002    (JP)    ............................. 2002-358191

(51) Int. Cl.
*H02J 1/10*    (2006.01)
*H02J 3/38*    (2006.01)
*H02J 7/34*    (2006.01)

(52) U.S. Cl. .......................................... 307/44; 327/333

(58) Field of Classification Search .................. 307/44; 327/530, 333; 365/78; 711/100

See application file for complete search history.

(56) References Cited

U.S. PATENT DOCUMENTS 4,608,504 A * 8/1986 Yamamoto .................... 326/86
5,016,223 A * 5/1991 Kimura et al. .............. 365/229

FOREIGN PATENT DOCUMENTS

JP            06042575        *  9/1995

* cited by examiner

*Primary Examiner*—Brian Sircus
*Assistant Examiner*—Carlos Amaya
(74) *Attorney, Agent, or Firm*—Volentine & Whitt, P.L.L.C.

(57) ABSTRACT

When an AC adaptor is removed and a power supply to a power node NP of a ROM writing apparatus is stopped, an analog switch which is controlled by a voltage at the power node NP is turned off. Thus, even if a power voltage VTG of a user board side is applied, a data signal DAT which is outputted from the user board is shut off by the analog switch and does not reach the power node NP via a diode. Therefore, a control terminal of a 3-state buffer is certainly set to "L". There is not a risk such that a pass current flows in the 3-state buffer and a breakdown by heat is caused. When a power source is shut off, a breakdown of an interface circuit due to a wraparound of a power voltage from another apparatus is prevented.

8 Claims, 5 Drawing Sheets

INTERFACE CIRCUIT

BACKGROUND OF THE INVENTION

1. Field of the Invention

The invention relates to an interface circuit for transmitting and receiving a signal between two apparatuses which are driven by different power sources.

2. Related Background Art

FIG. 2 is a constructional diagram of a conventional ROM writing system including a ROM writing apparatus disclosed in Literature 1 (refer to "PW66K Flash Writer System—User's Manual", Oki Electric Industry Co., Ltd., pages 6–8, May 19, 1999).

According to such a ROM writing system, a program or data which is sent from a host computer 1 is written into a flash memory built in a microcomputer 2a on a user board 2 and the system has a ROM writing apparatus 10. The host computer 1 and the ROM writing apparatus 10 are connected by, for example, a serial interface of the RS-232C standard. The ROM writing apparatus 10 is connected to a terminal on the side of the user board 2 by a probe via a probe cable.

The ROM writing apparatus 10 has a power unit 11 for generating a stable power voltage VCC of 5V (DC: direct current) from a voltage of 12V (DC) which is supplied from an AC (alternating current) adapter 3. An output side of the power unit 11 is connected to a power node NP. The power voltage VCC is applied from the power node NP to a control unit 12. Further, the ROM writing apparatus 10 has an interface unit (I/F) 13 for transmitting and receiving a signal between the control unit 12 and the microcomputer 2a on the user board 2.

The I/F 13 has 3-state buffers 13a, 13b, and 13c corresponding to the signals. The 3-state buffers 13a and 13b transmit a clock signal CK and write data WD which are outputted from the control unit 12 to the microcomputer 2a side. The 3-state buffer 13c receives data DAT which is read out from the microcomputer 2a and sends it to the control unit 12. When a signal which is inputted to a control terminal is at the high ("H") level, each of the 3-state buffers 13a to 13c sends the signal at an input terminal to an output terminal. When the signal to the control terminal is at the low ("L") level, each buffer sets the output terminal to a high impedance.

The control terminals of the 3-state buffers 13a to 13c are connected to the power node NP via pull-up resistors 14a to 14c, respectively, and controlled by the signal sent from the control unit 12. To prevent the control unit 12 from being broken by an abnormal input voltage, protective diodes 15 and 16 are connected to the output side of the 3-state buffer 13c so that they are connected to a ground voltage GND and the power voltage VCC in the opposite directions, respectively.

Further, to prevent an erroneous operation or the like that is caused by a difference between the power voltage VCC of the ROM writing apparatus 10 and a power voltage VTG (for example, 2 to 5 V) of the microcomputer side, the I/F 13 is driven by the power voltage VTG which is applied from a power unit 2b on the user board 2 side.

The power unit 2b of the user board 2 side generates the power voltage VTG which is necessary for the ordinary operation of the microcomputer 2a. As a high voltage VPP for writing data into the flash memory built in the microcomputer 2a, 12V (DC) which is supplied from the AC adaptor 3 to the ROM writing apparatus 10 is applied as it is.

In such a ROM writing system, the data which is written from the host computer 1 into the flash memory built in the microcomputer 2a is supplied to the control unit 12 of the ROM writing apparatus 10 via the RS-232C interface. The supplied data is converted into data in a format according to a writing procedure of the microcomputer 2a side by the control unit 12 and sent to the I/F 13 in accordance with a predetermined protocol. In the I/F 13, the supplied data is converted into a signal level corresponding to the power voltage VTG of the user board 2 side and outputted to the microcomputer 2a side via the probe cable. Thus, the data is written into the flash memory built in the microcomputer 2a.

To check the data written into the flash memory, the data DAT read out from the microcomputer 2a is sent to the control unit 12 via the 3-state buffer 13c. In the control unit 12, the written data is compared with the read-out data and whether the data has correctly been written or not can be discriminated.

However, the conventional ROM writing system has the following problems.

FIG. 3 is an explanatory diagram of the problems in the conventional ROM writing system.

The ROM writing apparatus 10 and the user board 2 are connected by the probe cable. A power source of the user board 2 is inputted. When the power source of the ROM writing apparatus 10 is shut off (in a state where the AC adaptor 3 is removed) in a state where the data signal DAT at the "H" level is outputted from the user board 2, the I/F 13 generates heat and, depending on circumstances, a thermal breakdown occurs.

Such a phenomenon is caused because when the AC adaptor 3 is removed, the power voltage VCC is not applied to the power node NP, the protective diode 16 which is supposed to be connected in the reverse direction is connected in the forward direction, so that an output signal of the 3-state buffer 13c is fed back to the control terminal via the protective diode 16 and the pull-up resistor 14c.

As shown in an example in FIG. 3, the 3-state buffer 13c has a power terminal VD, a ground terminal VS, an input terminal I, an output terminal O, and a control terminal C and is constructed by inverters 21 and 22, an NAND 23, an NOR 24, a PMOS 25, and an NMOS 26.

The control terminal C of the 3-state buffer 13c is connected to an input side of the inverter 21. An output side of the inverter 21 is connected to an input side of either the inverter 22 or the NAND 23. An output side of the inverter 22 is connected to one of input sides of the NOR 24. The input terminal I is connected to the other input side of each of the NAND 23 and the NOR 24. Output sides of the NAND 23 and the NOR 24 are connected to gates of the PMOS 25 and NMOS 26, respectively. Drains of the PMOS 25 and NMOS 26 are connected to the output terminal O.

In the interface by such a 3-state buffer 13c, in a state where the power voltage VCC (for example, 5V) is supplied to the power node NP, the power voltage VTG (for example, 5V) is applied from the user board 2 to the power terminal VD, and the data signal DAT at the "H" level is further inputted to the input terminal I, the signal at the output terminal O becomes almost the power voltage VTG.

When the AC adaptor 3 is removed here, the power voltage VCC which is supplied to the power node NP is extinguished. Thus, the "H" signal at the output terminal O of the 3-state buffer 13c is supplied to the control unit 12 via the protective diode 16 and the power node NP. Thus, a load current flows in the control unit 12 and an electric potential of the power node NP drops.

Although the electric potential of the power node NP is applied to the control terminal C of the 3-state buffer 13c via the pull-up resistor 14c, when the electric potential of the control terminal C becomes equal to almost ½ of the power voltage VTG, a pass current flows in a PMOS 21a and an NMOS 21b which construct the inverter 21. Thus, the phenomenon such that the I/F 13 generates the heat and, depending on circumstances, it results in the thermal breakdown occurs.

SUMMARY OF THE INVENTION

It is, therefore, an object of the invention to solve the above problems and provide an interface circuit for transmitting/receiving a signal between two apparatuses which are driven by different power source, respectively.

According to the present invention, there is provided an interface circuit for inputting/outputting a signal between first and second apparatuses having different power units, respectively, comprising:
  a power node to which a first power voltage that is supplied from the power unit of the first apparatus is outputted;
  a 3-state buffer which is driven by a second power voltage that is supplied from the power unit of the second apparatus and in which the output of the signal that is supplied from the second apparatus is controlled by an electric potential at the power node; and
  an analog switch which is driven by the second power voltage and in which a connection between an output side of the 3-state buffer and a logic circuit in the first apparatus is controlled by the electric potential at the power node.

Further, according to the present invention, there is provided an interface circuit for inputting/outputting a signal between first and second apparatuses having different power units, respectively, comprising:
  a power node to which a first power voltage that is supplied from the power unit of the first apparatus is outputted;
  a voltage detector which detects a voltage at the power node and outputs a control signal when the voltage exceeds a reference voltage;
  a 3-state buffer which is driven by a second power voltage that is supplied from the power unit of the second apparatus and in which the output of the signal that is supplied from the second apparatus is controlled by an electric potential at the power node; and
  an analog switch which is driven by the second power voltage and in which a connection between an output side of the 3-state buffer and a logic circuit in the first apparatus is controlled by the control signal.

Moreover, according to the present invention, there is provided an interface circuit for inputting/outputting a signal between first and second apparatuses having different power units, respectively, comprising:
  a power node to which a first power voltage that is supplied from the power unit of the first apparatus is outputted;
  a voltage detector which outputs a control signal when a voltage at the power node exceeds a reference voltage;
  a 3-state buffer which is driven by a second power voltage that is supplied from the power unit of the second apparatus, controls the signal that is supplied from the second apparatus in accordance with a voltage that is applied to a control terminal and supplies the signal to a logic circuit in the first circuit; and an analog switch which is driven by the second power voltage and in which a connection between the power node and the control terminal of the 3-state buffer is controlled by the control signal.

The above and other objects and features of the present invention will become apparent from the following detailed description and the appended claims with reference to the accompanying drawings.

DETAILED DESCRIPTION OF THE PREFERRED EMBODIMENTS

First Embodiment

Figure 1:
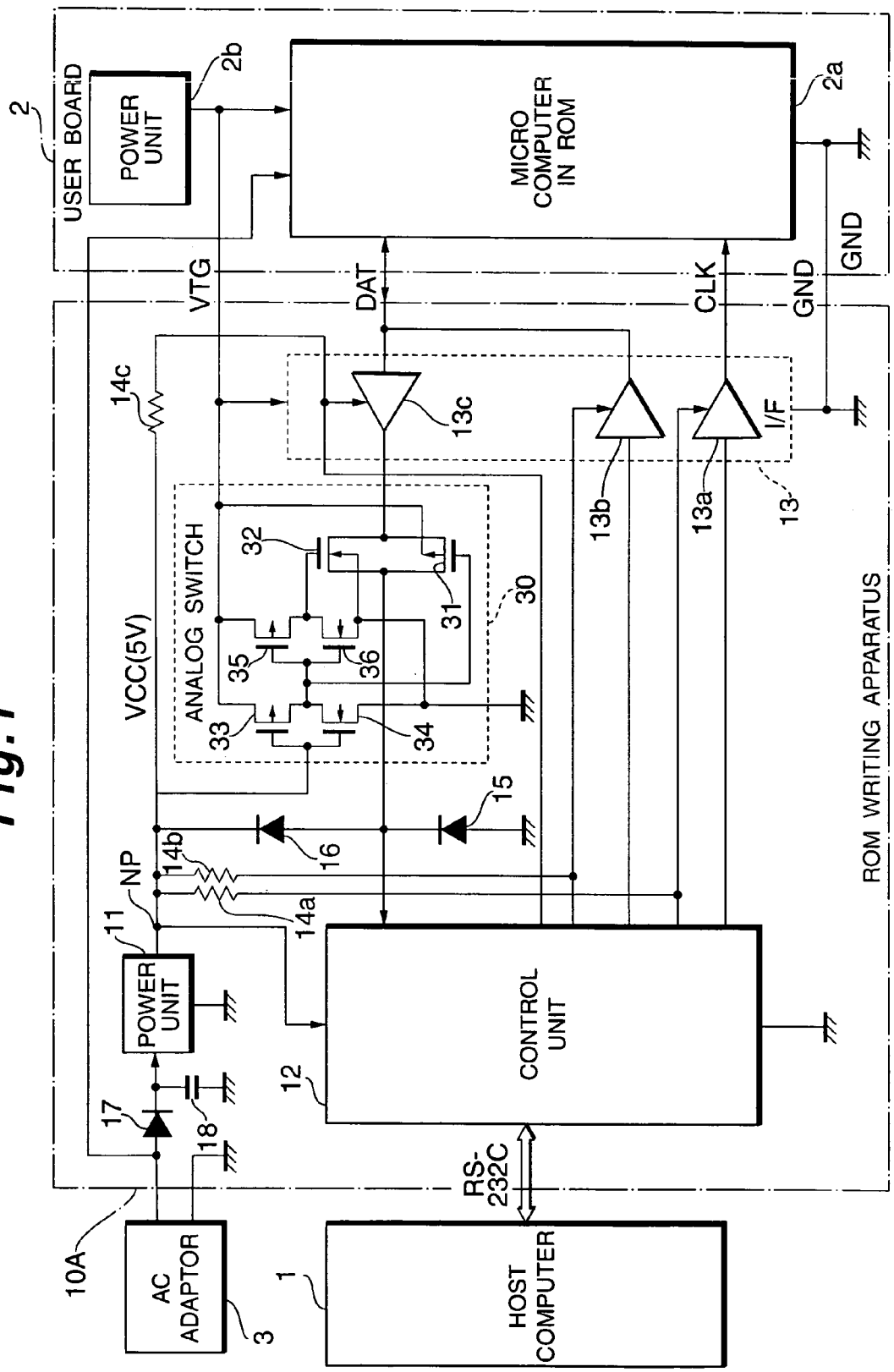
FIG. 1 is a constructional diagram of a ROM writing system showing the first embodiment of the invention.
Figure 2:
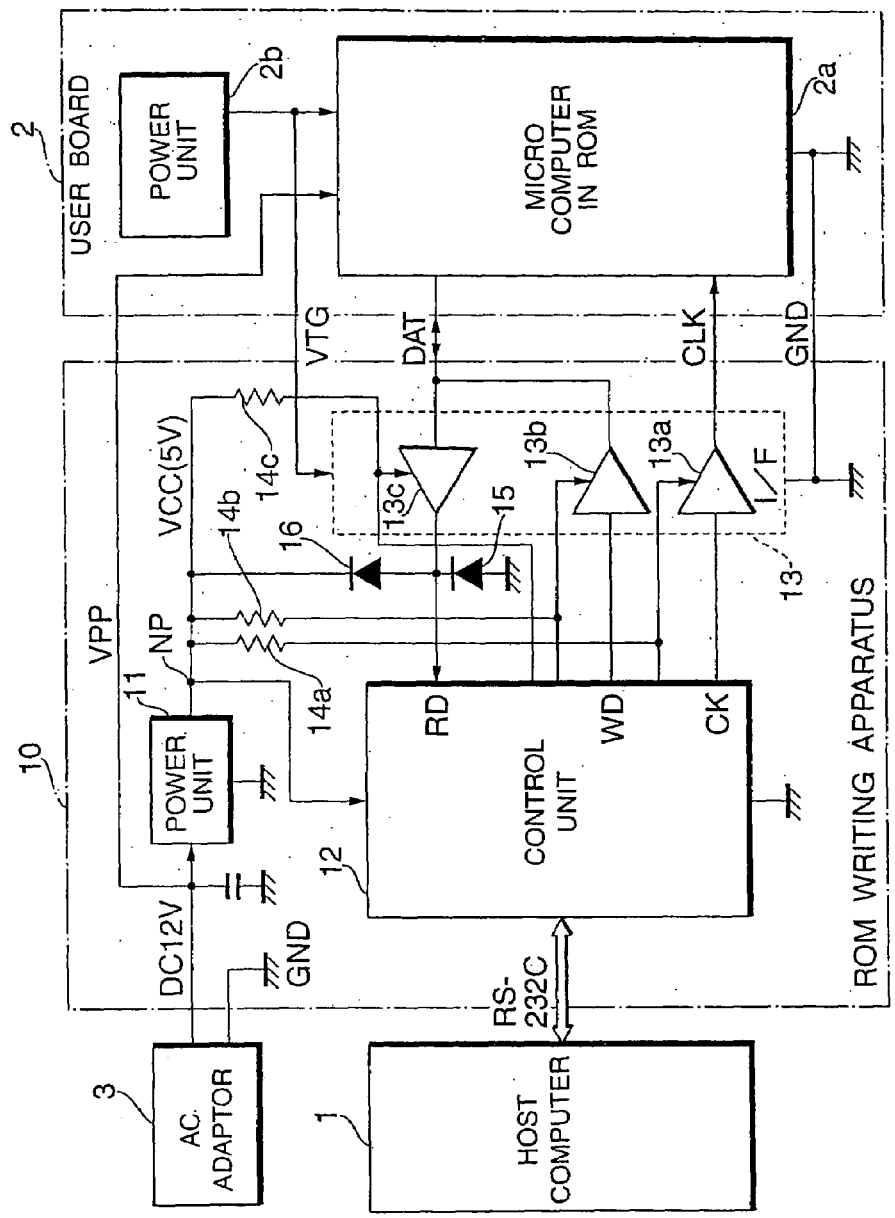
FIG. 2 is a constructional diagram of a conventional ROM writing system including a ROM writing apparatus.
Figure 3:
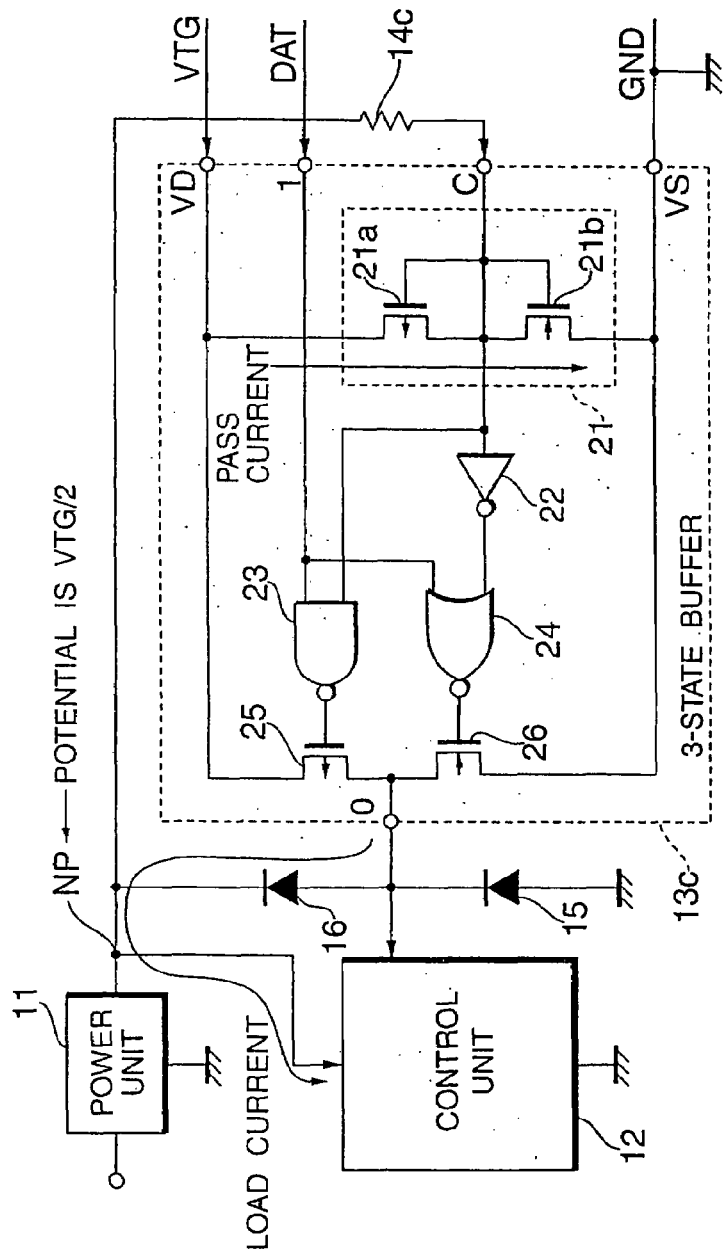
FIG. 3 is an explanatory diagram of problems in the conventional ROM writing system.

FIG. 1 is a constructional diagram of a ROM writing system showing the first embodiment of the invention, in which component elements which are common to those in FIG. 2 are designated by the same reference numerals.

According to the ROM writing system, in a manner similar to the ROM writing system of FIG. 2, a program or data which is sent from the host computer 1 is written into the flash memory built in the microcomputer 2a on the user board 2 and the system has a ROM writing apparatus 10A. The host computer 1 and the ROM writing apparatus 10A are connected by, for example, the serial interface of the RS-232C standard. The ROM writing apparatus 10A is connected to the terminal on the side of the user board 2 via the probe cable.

The ROM writing apparatus 10A has the power unit 11 which receives a voltage of 12V (DC) which is supplied from the AC adapter 3 via a diode 17 for preventing a reverse current and a capacitor 18 for smoothing and generates the stable power voltage VCC of 5V (DC). The output side of the power unit 11 is connected to the power node NP. The power voltage VCC is applied from the power node NP to the control unit 12 for making write control. Further, the ROM writing apparatus 10A has the interface unit (I/F) 13 for transmitting and receiving the signal between the control unit 12 and the microcomputer 2a on the user board 2.

The I/F 13 has the 3-state buffers 13a to 13c corresponding to the signals. The 3-state buffers 13a and 13b transmit the clock signal CK and the write data WD which are outputted from the control unit 12 to the microcomputer 2a side, respectively. The 3-state buffer 13c receives the data DAT which is read out from the microcomputer 2a and sends it to the control unit 12. When the signal which is inputted to the control terminal is at the "H" level, each of the 3-state buffers 13a to 13c sends the signal at the input terminal to the output terminal. When the signal to the control terminal is at the "L" level, each buffer sets the output terminal to a high impedance.

The control terminals of the 3-state buffers 13a to 13c are connected to the power node NP via the pull-up resistors 14a to 14c, respectively, and controlled by the control unit 12. To prevent the erroneous operation or the like that is caused by a difference between the power voltage VCC of the ROM writing apparatus 10A and the power voltage VTG (for example, 2 to 5 V) on the microcomputer side, the I/F 13 is driven by the power voltage VTG which is applied from the power unit 2b on the user board 2 side.

The power unit 2b on the user board 2 generates the power voltage VTG which is necessary for the ordinary operation of the microcomputer 2a. As a high voltage VPP for writing data into the flash memory built in the microcomputer 2a, 12V (DC) which is supplied from the AC adaptor 3 to the ROM writing apparatus 10A is applied as it is.

The output side of the 3-state buffer 13c is connected to the control unit 12 via an analog switch 30 which is driven by the power voltage VTG of the user board 2. The analog switch 30 is constructed by: a switch portion in which a PMOS 31 and an NMOS 32 are connected in parallel; and inverters of two stages for ON/OFF-controlling the PMOS 31 and the NMOS 32.

Board potentials of the PMOS 31 and the NMOS 32 are connected to a power voltage side and a ground voltage side, respectively. An input side of the inverter at the first stage constructed by a PMOS 33 and an NMOS 34 is connected to the power node NP and an output side of the inverter is connected to a gate of the PMOS 31. An output side of the inverter at the next stage constructed by a PMOS 35 and an NMOS 36 is connected to a gate of the NMOS 32.

To prevent a breakdown of the control unit 12 which is caused by an abnormal input voltage, the protective diodes 15 and 16 are connected to an output side of the analog switch 30 so that they are connected to the ground voltage GND and the power voltage VCC in the opposite directions, respectively.

Subsequently, the operation will be described.

The ROM writing apparatus 10A and the host computer 1 are connected by an RS-232C interface. The user board 2 serving as a writing target is connected to the ROM writing apparatus 10A via a probe cable. Further, a voltage of 12V (DC) is supplied from the AC adaptor 3 to the ROM writing apparatus 10A and a power source of the user board 2 is applied thereto. Thus, the analog switch 30 is set to the ON state.

In such a state, the data which is written to the flash memory built in the microcomputer 2a is supplied from the host computer 1 to the control unit 12 of the ROM writing apparatus 10A via the RS-232C interface. The supplied data is converted into data in a format according to a writing procedure on the microcomputer 2a side by the control unit 12 and transmitted to the I/F 13 in accordance with a predetermined protocol.

In the I/F 13, the supplied data is converted into a signal level corresponding to the power voltage VTG on the user board 2 side and transmitted to the microcomputer 2a via the probe cable. Thus, the data is written into the flash memory built in the microcomputer 2a.

To check the data written in the flash memory, the data DAT read out from the microcomputer 2a is sent to the control unit 12 via the 3-state buffer 13c and the analog switch 30. In the control unit 12, the written data is compared with the read-out data and whether the data has correctly been written or not is discriminated.

It is now assumed that the AC adaptor 3 on the ROM writing apparatus 10A was removed in a state where the power source on the user board 2 side has been turned on. Thus, the power voltage VCC applied to the power node NP is extinguished. The power node NP is connected to the ground voltage GND via a transistor or the like constructing the logic circuit of the control unit 12. An electric potential of the power node NP becomes equal to almost the ground voltage GND.

Since the analog switch 30 is on/off-controlled on the basis of the electric potential of the power node NP, when the power node NP becomes equal to the ground voltage GND, the analog switch 30 is turned off. Thus, the output signal of the 3-state buffer 13c does not appear to the output side of the analog switch 30. Therefore, the electric potential of the power node NP is held at the ground voltage GND and the I/F 13 is perfectly turned off.

As mentioned above, according to the ROM writing apparatus 10A in the ROM writing system of the first embodiment, the analog switch 30 which is controlled by the electric potential of the power node NP is provided on the output side of the I/F 13. There is, consequently, an advantage such that even if the power source of the ROM writing apparatus 10A is turned off in a state where the power source of the user board 2 has been turned on, wraparound of the power source of the user board 2 is blocked and the heat generation or thermal breakdown of the I/F 13 can be prevented.

Second Embodiment

Figure 4:
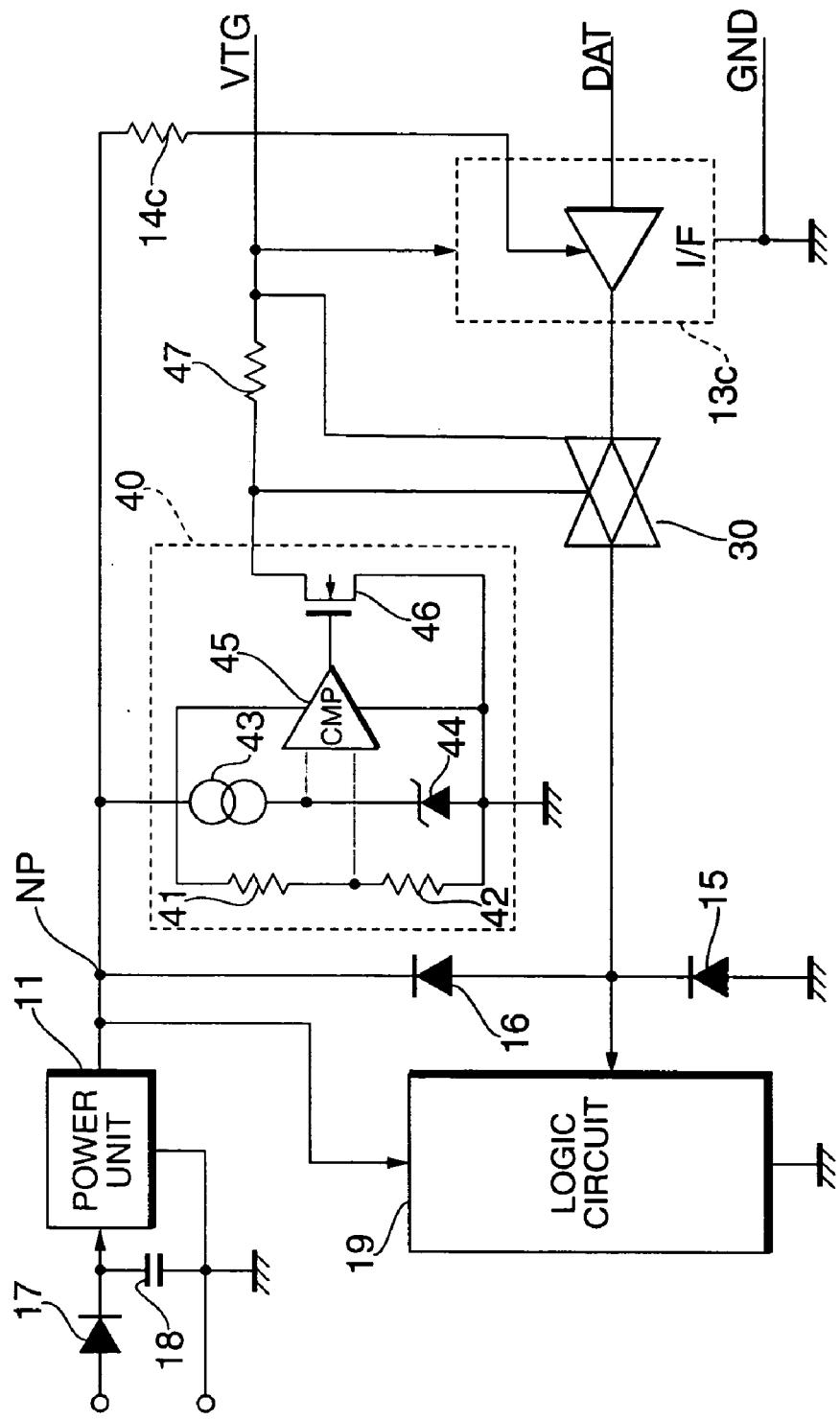
FIG. 4 is a constructional diagram of an interface circuit showing the second embodiment of the invention.

FIG. 4 is a constructional diagram of an interface circuit showing the second embodiment of the invention. In FIG. 4, component elements which are common to those in FIG. 1 are designated by the same reference numerals.

In a manner similar to, for example, the ROM writing system of FIG. 1, the interface circuit of FIG. 4 is provided to transmit and receive signals between the first apparatus (for example, ROM writing apparatus) and the second apparatus (for example, user board) which have different power sources, respectively.

The interface circuit has the power unit 11 which receives a DC voltage supplied from an AC adaptor (not shown) via the diode 17 for preventing a reverse current and the capacitor 18 for smoothing and forms the stable power voltage VCC. An output side of the power unit 11 is connected to the power node NP and the power voltage VCC is applied from the power node NP to a logic circuit 19.

Further, the interface circuit has the 3-state buffer 13c for receiving the data signal DAT which is supplied from the second apparatus (not shown). The 3-state buffer 13c supplies a signal at the input terminal to the output terminal when the signal which is inputted to the control terminal is at the "H" level. The 3-state buffer 13c sets the output terminal to a high impedance when the signal at the control terminal is at the "L" level. The control terminal of the 3-state buffer 13c is connected to the power node NP via the pull-up resistor 14c. The 3-state buffer 13c is driven by the power voltage VTG which is applied from the second apparatus side in order to prevent an erroneous operation or the like that is caused by the difference between the power voltage VCC and the power voltage VTG on the second apparatus side.

The output side of the 3-state buffer 13c is connected to the logic circuit 19 via the analog switch 30 which is driven by the power voltage VTG on the second apparatus side. The analog switch 30 on/off-controls the connection between the input side and the output side by the signal which is inputted to the control terminal. An output signal of a voltage detector 40 is inputted to the control terminal.

The voltage detector 40 detects the voltage at the power node NP and generates an output signal at the "H" level when the detected voltage exceeds a reference voltage. The voltage detector 40 has: resistors 41 and 42 for dividing the voltage at the power node NP; and a constant current circuit 43 and a Zener diode 44 for forming a reference value. The divided voltage is compared with the reference value by a comparing circuit(CMP) 45. An output side of the comparing circuit 45 is connected to a gate of an NMOS 46 whose source is connected to the ground voltage GND and in which an open drain is formed.

A drain of the NMOS 46 is connected to the power voltage VTG on the second apparatus side via a load resistor 47. The control signal for the analog switch 30 is outputted from the drain of the NMOS 46.

The operation will now be described.

The 3-state buffer 13c and the analog switch 30 are driven by the power voltage VTG which is applied from the second apparatus side. When the DC voltage is supplied from the AC adaptor, the power voltage VCC is formed by the power unit 11 and outputted to the power node NP. Thus, the output signal of the voltage detector 40 is set to the "H" level and the analog switch 30 is turned on. The power voltage VCC is inputted to the control terminal of the 3-state buffer 13c via the pull-up resistor 14c. Thus, the data signal DAT supplied from the second apparatus side passes the 3-state buffer 13c and the analog switch 30 and is outputted to the control unit 12.

When the supply of the DC voltage from the AC adaptor is stopped and the voltage at the power node NP drops to a level which is equal to or less than the reference voltage, the output signal of the voltage detector 40 is set to the "L" level. Thus, the analog switch 30 is turned off, the output signal of the 3-state buffer 13c is shut off, and the power node NP is set to the ground voltage GND.

As mentioned above, according to the interface circuit of the second embodiment, the analog switch 30 is provided on the output side of the 3-state buffer 13c, the voltage detector 40 to detect the voltage at the power node NP is provided, and the analog switch 30 is controlled by the output signal of the voltage detector 40.

There is, consequently, an advantage such that even if the power source on the first apparatus side is shut off in a state where the power source of the second apparatus has been turned on, wraparound of the power voltage VTG of the second apparatus is certainly blocked and the heat generation or thermal breakdown of the 3-state buffer 13c can be prevented. There is an advantage such that since the output signal of the voltage detector 40 does not exceed the power voltage VTG, even when the power voltage VCC is higher than the power voltage VTG, there is not a risk such that the analog switch 30 is broken or an erroneous operation is executed.

Third Embodiment

Figure 5:
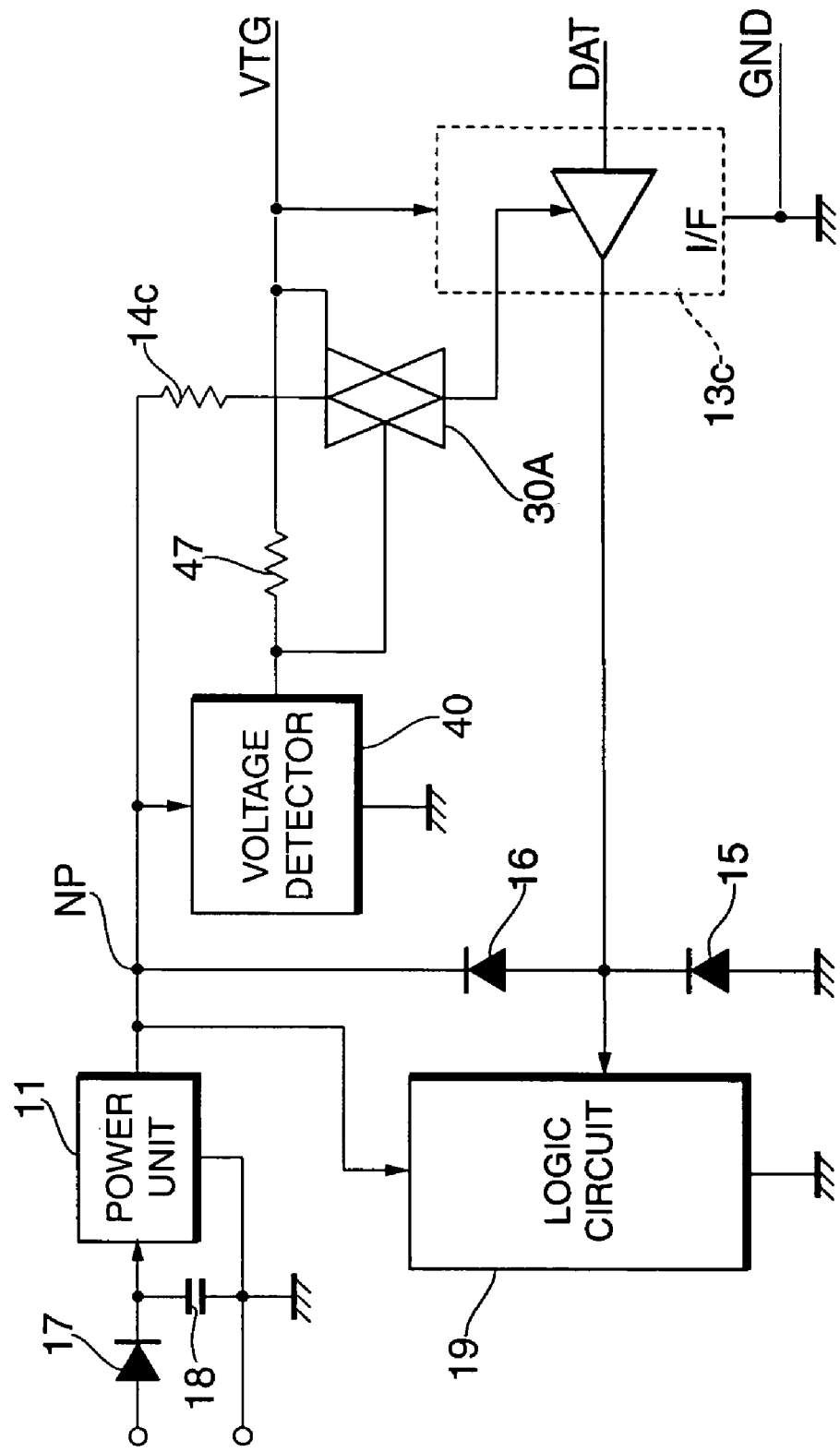
FIG. 5 is a constructional diagram of an interface circuit showing the third embodiment of the invention.

FIG. 5 is a constructional diagram of an interface circuit showing the third embodiment of the invention, in which component elements which are common to those in FIG. 4 are designated by the same reference numerals.

According to the interface circuit, the analog switch 30 in FIG. 4 is deleted, the output side of the 3-state buffer 13c is directly connected to the control unit 12, and an analog switch 30A is inserted between the pull-up resistor 14c and the control terminal of the 3-state buffer 13c. The analog switch 30A is driven by the power voltage VTG which is applied from the second apparatus side and on/off-controlled by the output signal of the voltage detector 40. Other constructions are similar to those in FIG. 4.

Subsequently, the operation will be described.

When the power voltage VTG is applied from the second apparatus side, the 3-state buffer 13c and the analog switch 30A are driven. When the DC voltage is supplied from the AC adaptor, the power voltage VCC is formed by the power unit 11 and outputted to the power node NP. Thus, the output signal of the voltage detector 40 is set to the "H" level, the analog switch 30A is turned on, and the voltage at the power node NP is applied to the control terminal of the 3-state buffer 13c via the pull-up resistor 14c and the analog switch 30A. The data signal DAT which is supplied from the second apparatus side passes the 3-state buffer 13c and is outputted to the control unit 12.

When the supply of the DC voltage from the AC adaptor is stopped and the voltage at the power node NP drops to a level which is equal to or less than the reference voltage, the output signal of the voltage detector 40 is set to the "L" level. Thus, the analog switch 30A is turned off, the control signal to the 3-state buffer 13c is set to the "L" level, and the data signal DAT which is supplied from the second apparatus side is shut off.

As mentioned above, according to the interface circuit of the third embodiment, the control signal is inputted to the 3-state buffer 13c via the analog switch 30A, the voltage detector 40 to detect the voltage at the power node NP is provided, and the analog switch 30A is controlled by the output signal of the voltage detector 40. Therefore, in addition to the advantages similar to those in the second embodiment, there is an advantage such that since the 3-state buffer 13c and the control unit 12 are directly connected, the decrease in signal level, delay of the signal, or the like due to the analog switch is not caused.

The invention is not limited to the above embodiments but many modifications are possible. For example, there are the following modifications.

(a) Although the invention has been described with respect to the interface circuit in the ROM writing system, the invention can be applied as an interface circuit between two apparatuses having different power sources, respectively.

(b) The circuit constructions of the analog switch 30 and the voltage detector 40 are not limited to those shown as examples.

As described in detail above, according to the invention, the interface circuit has the analog switch for on/off-controlling the circuit between the output side of the 3-state buffer and the logic circuit in the first apparatus or the path of the control signal to the 3-state buffer by the power voltage of the first apparatus. Therefore, when the power voltage of the first apparatus is extinguished, the power voltage of the second apparatus side does not reach the control terminal of the 3-state buffer and the heat generation or thermal breakdown of the 3-state buffer can be prevented.

What is claimed is:

1. An interface circuit for inputting/outputting a signal between first and second apparatuses having respective different power units, comprising:
   a power node which is coupled to a first power voltage that is supplied from the power unit of said first apparatus;
   a 3-state buffer which is driven by a second power voltage that is supplied from the power unit of said second apparatus and in which an output of a signal that is supplied from said second apparatus is controlled by an electric potential at said power node; and an analog switch which is driven by said second power voltage and in which a connection between an output side of said 3-state buffer and a logic circuit in said first apparatus is controlled by the electric potential at said power node.

2. An interface circuit for inputting/outputting a signal between first and second apparatuses having respective different power units, comprising:

a power node which is coupled to a first power voltage that is supplied from the power unit of said first apparatus;

a voltage detector which detects a voltage at said power node and outputs a control signal when said voltage exceeds a reference voltage;

a 3-state buffer which is driven by a second power voltage that is supplied from the power unit of said second apparatus and in which an output of a signal that is supplied from said second apparatus is controlled by an electric potential at said power node; and an analog switch which is driven by said second power voltage and in which a connection between an output side of said 3-state buffer and a logic circuit in said first apparatus is controlled by said control signal.

3. An interface circuit for inputting/outputting a signal between first and second apparatuses having respective different power units, comprising:

a power node which is coupled to a first power voltage that is supplied from the power unit of said first apparatus;

a voltage detector which outputs a control signal when a voltage at said power node exceeds a reference voltage;

a 3-state buffer which is driven by a second power voltage that is supplied from the power unit of said second apparatus, which controls a signal that is supplied from said second apparatus in accordance with a control voltage that is applied to a control terminal thereof, and which supplies said signal to a logic circuit in said first circuit; and an analog switch which is driven by said second power voltage and in which a connection between said power node and the control terminal of said 3-state buffer is controlled by said control signal to provide the control voltage.

4. An interface circuit comprising:

a first circuit, and a first power unit that supplies power voltage to the first circuit;

a second circuit, and a second power unit that supplies power voltage to the second circuit;

a 3-state buffer that sends data from the second circuit to the first circuit;

a protective diode, connected in a reverse direction between a data input terminal of the first circuit and a power output terminal of the first power unit, that protects the first circuit, wherein the 3-state buffer has a driving terminal that receives the power voltage from the second circuit as a driving voltage, and a control terminal that receives the power voltage from the first circuit as a control voltage; and an analog switch that prevents current produced by a potential difference between the driving voltage and control voltage from flowing to the protective diode, by culling off sending of the data from a data output terminal of the 3-state buffer to the data input terminal of the first circuit when supply of the power voltage from the first power unit is terminated.

5. The interface circuit of claim 4, wherein the analog switch is coupled to the data output terminal of the 3-state buffer, and cuts off a connection between the 3-state buffer and the first circuit responsive to the power voltage supplied by the first power unit.

6. The interface circuit of claim 5, wherein the analog switch has an input directly coupled to the first power circuit.

7. The interface circuit of claim 5, further comprising:

a voltage detector that detects a voltage level of the power voltage supplied by the first power unit, compares the detected voltage level to a reference voltage level, and provides a detector signal indicative of the comparison, the analog switch cutting sending off of the data responsive to the detector signal.

8. The interface circuit of claim 4, further comprising:

a voltage detector that detects a voltage level of the power voltage supplied by the first power unit, compares the detected voltage level to a reference voltage level, and provides a detector signal indicative of the comparison, wherein the analog switch has an input terminal coupled to the power voltage supplied by the first power unit and an output terminal coupled to the control terminal of the 3-state buffer, the analog switch providing the power voltage as the control voltage to the 3-state buffer to control sending of the data by the 3-state buffer, responsive to the detector signal.

* * * * *